United States Patent
Yeh et al.

(10) Patent No.: US 11,990,780 B2
(45) Date of Patent: May 21, 2024

(54) ELECTRONIC DEVICE AND CHARGING FOOT SEAT THEREOF

(71) Applicant: WISTRON CORP., New Taipei (TW)

(72) Inventors: Pei-Hsin Yeh, New Taipei (TW); Ting Fang Lai, New Taipei (TW)

(73) Assignee: WISTRON CORP., New Taipei (TW)

( * ) Notice: Subject to any disclaimer, the term of this patent is extended or adjusted under 35 U.S.C. 154(b) by 343 days.

(21) Appl. No.: 17/226,208

(22) Filed: Apr. 9, 2021

(65) Prior Publication Data

US 2022/0216709 A1 Jul. 7, 2022

(30) Foreign Application Priority Data

Jan. 6, 2021 (TW) .................................. 110100420

(51) Int. Cl.
*H02J 7/00* (2006.01)
*G06F 1/16* (2006.01)
*G06F 1/18* (2006.01)
*H05K 7/14* (2006.01)

(52) U.S. Cl.
CPC .......... *H02J 7/0042* (2013.01); *G06F 1/1632* (2013.01); *G06F 1/182* (2013.01); *H05K 7/1427* (2013.01); *G06F 1/1616* (2013.01)

(58) Field of Classification Search
CPC ...... H02J 7/0042; H02J 7/0045; H02J 7/0027; H02J 7/025; G06F 1/1632; G06F 1/182; G06F 1/1616; G06F 1/26; H05K 7/1427; H01R 13/629; H01R 13/62983

See application file for complete search history.

(56) References Cited

U.S. PATENT DOCUMENTS

| 5,357,185 A | * | 10/1994 | Chen ................... | H01M 50/244 320/110 |
| 7,316,592 B2 | * | 1/2008 | Chan .................. | H01R 13/6485 200/530 |
| 2008/0152183 A1 | * | 6/2008 | Janik .................... | H04R 1/1066 381/375 |
| 2009/0179501 A1 | * | 7/2009 | Randall ................. | H02J 7/0044 307/145 |
| 2011/0276885 A1 | * | 11/2011 | Gibson ............. | H04N 21/4131 348/E7.083 |

(Continued)

FOREIGN PATENT DOCUMENTS

| CN | 210075306 U | 2/2020 |
| CN | 111277011 A | 6/2020 |

OTHER PUBLICATIONS

TW Office Action dated Sep. 8, 2021 in Taiwan application No. 110100420.

*Primary Examiner* — Stacy Whitmore
(74) *Attorney, Agent, or Firm* — McClure, Qualey & Rodack, LLP

(57) ABSTRACT

An electronic device and charging foot seat thereof are provided, where the electronic device adapted to be charged by a charger pad, and the charging foot seat includes a foot pad configured to be partially embedded into a casing of the electronic device, and a plurality of metal pins disposed through and protruding from the foot pad and configured to be electrically connected to at least one circuit board of the electronic device and configured to contact the charger pad so as to form a charging path over the circuit board and the charger pad for charging the electronic device.

18 Claims, 12 Drawing Sheets

(56) References Cited

U.S. PATENT DOCUMENTS

| | | | |
|---|---|---|---|
| 2013/0162211 A1* | 6/2013 | Yurchenco | G06F 1/26 |
| | | | 320/137 |
| 2016/0345086 A1* | 11/2016 | Chamberlin | H04R 1/342 |
| 2018/0123367 A1* | 5/2018 | Higgins | H01R 13/2414 |
| 2018/0359877 A1* | 12/2018 | Wang | H01M 10/6556 |
| 2019/0052026 A1* | 2/2019 | Shi | H02J 7/0045 |
| 2020/0052513 A1* | 2/2020 | Zhan | H02J 7/0044 |
| 2020/0221198 A1* | 7/2020 | Pupecki | H04R 1/345 |
| 2023/0012464 A1* | 1/2023 | Choi | H02J 7/02 |

* cited by examiner

ELECTRONIC DEVICE AND CHARGING FOOT SEAT THEREOF

CROSS-REFERENCE TO RELATED APPLICATIONS

This non-provisional application claims priority under 35 U.S.C. § 119(a) on Patent Application No(s). 110100420 filed in Taiwan (R.O.C.) on Jan. 6, 2021, the entire contents of which are hereby incorporated by reference.

TECHNICAL FIELD

The disclosure relates to an electronic device, more particularly to an electronic device and charging foot seat thereof that can be charged via metal pins.

BACKGROUND

With the development of modern wireless charging technologies, more and more portable electronic devices offer tangle-free charging solutions so there is no need to carry tangled cords or hunt for a power outlet. Thus, wireless charging is becoming a future trend of portable electronic devices.

Generally, there are two ways of wirelessly charging portable electronic devices, one is using electromagnetic induction and the other is metal pin. The formal solution is costly and it requires the coils respectively in the charging pad and the electronic device to come close enough to create an electromagnetic coupling to create an electric current flowing to the receiving coil to charge the portable electronic device, thus the electronic device must be placed to make the coils align with each other, or the charging is inefficient or fails to create current. In fact, the electromagnetic coupling is unable to support fast charging for high power consumption devices, the charging of the coil-type wireless chargers in the market are all inefficient and easily produce heat due to the electromagnetic coupling, heating the contact surfaces between the charger and the device and thus causing battery deterioration and shortening service life. That is, the coil-type wireless charger is not only costly but also inefficient and having heat problems, and the situation will get worse with the increase of the power consumption of future electronic products.

The latter solution adapts metal pin as the path to provide electric energy, the use of metal pin is also wireless but costs less than the coil-type wireless chargers, in addition, the metal pin is efficient and stable in power transmission and can offer fast charging and avoid the problems caused by the coil-type wireless chargers. In addition, the metal pin occupies a small space and thus is favorable for product minimization. Thus, there are more and more electronic products that adapt the metal pin in wireless charging.

The metal pins typically are arranged on the charger, and the electronic product has mating hoes for the insertion of the pins, thus the charging involves inserting male pins into female ports. However, the electronic product must be placed in a specific way to align the pins and the holes and thus leading to an inflexible and inconvenient charging operation.

SUMMARY

Accordingly, the present disclosure provides an electronic device and charging foot seat thereof that have the advantage of metal pin charging while being more flexible and convenient.

One embodiment of the disclosure provides an electronic device, comprising a casing, at least one circuit board accommodated in the casing, a foot pad protruding from the casing, and a plurality of metal pins disposed through and protruding from the foot pad and electrically connected to the at least one circuit board.

Another embodiment of the disclosure provides an electronic device adapted to be charged by a charger pad. The electronic device includes a casing adapted to be placed on the charger pad, at least one circuit board, accommodated in the casing, a foot pad protruding from the casing, and a plurality of metal pins disposed through and protruding from the foot pad and electrically connected to the at least one circuit board. The plurality of metal pins are configured to contact the charger pad so as to form a charging path over the at least one circuit board and the charger pad for charging the electronic device.

Another embodiment of the disclosure provides a charging foot seat for an electronic device. The electronic device includes a casing and at least one circuit board accommodated in the casing. The charging foot seat includes a foot pad configured to be partially embedded into the casing, and a plurality of metal pins disposed through and protruding from the foot pad and configured to be electrically connected to the at least one circuit board.

According to the electronic device and the charging foot seat as discussed in the above embodiments of the disclosure, the metal pins being electrically connected to the circuit board are disposed through and protruding the foot pad on the casing of the electronic device; that is, the electronic device has metal pins on its foot pad, which allows the electronic device to adapt the novel charger pad.

In specific, the charger pad has two electrode areas of opposite electrodes for forming a charging path with the metal pins of the electronic device as discussed in the above embodiments of the disclosure. Thus, when the electronic device as discussed above is placed on the charger pad with the metal pins on the foot pad in contact the respective areas of the charger pad, a charging path will be formed over the metal pins and the charger pad. As such, the foot pad of the disclosure not only can be served as the conventional rubber feet but the elastic metal pins thereon can also be part of the charging path for charging the electronic device from the novel charger pad.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
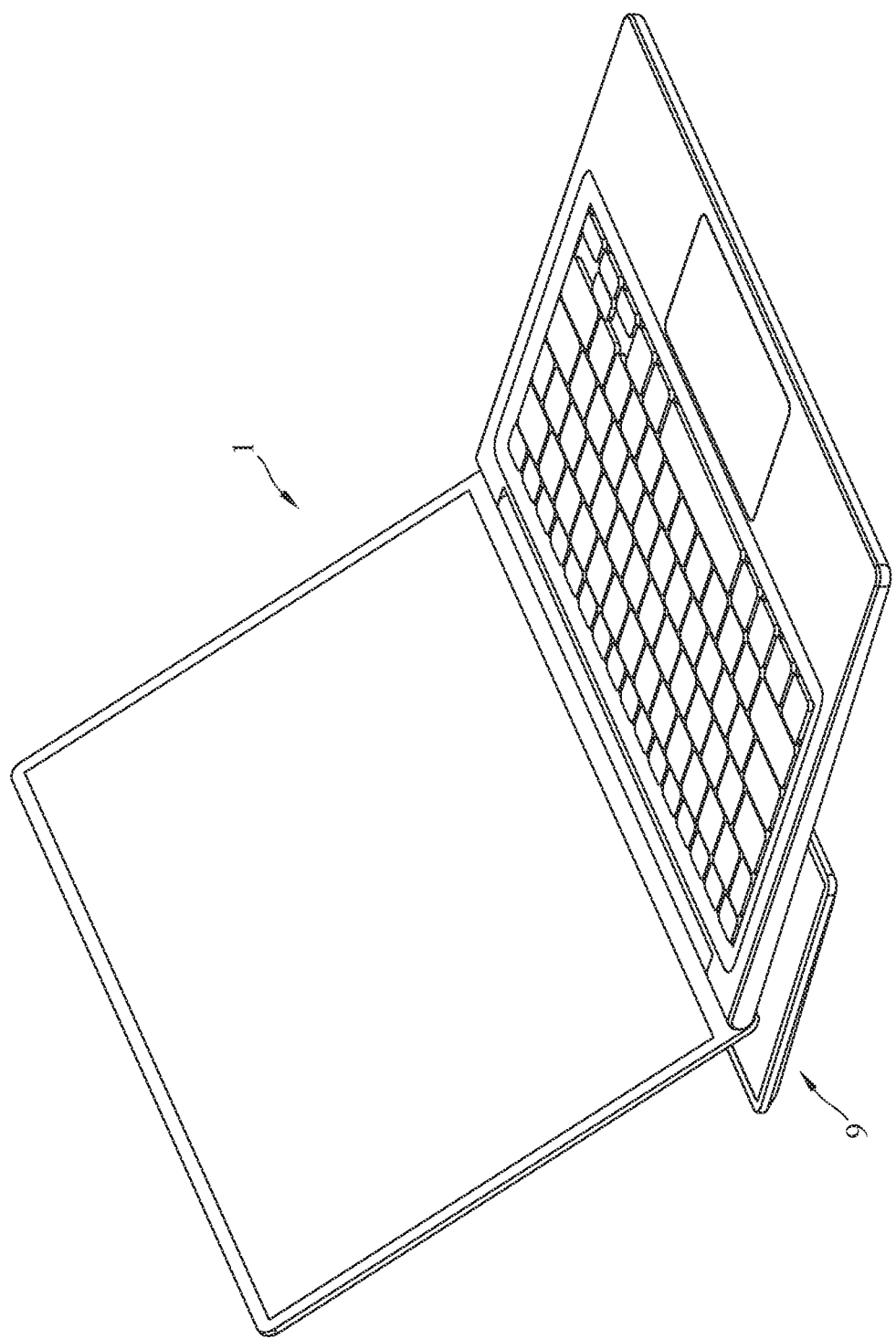
FIG. 1 is a perspective view of an electronic device according to one embodiment of the disclosure when being placed on a charger pad.

In the following detailed description, for purposes of explanation, numerous specific details are set forth in order to provide a thorough understanding of the disclosed embodiments. It will be apparent, however, that one or more embodiments may be practiced without these specific details.

The following embodiments will be described with reference to the drawings. For the purpose of clear illustration, some conventional elements and components may be illustrated in a simple and clear manner. Some of the features in the drawings may be slightly exaggerated or illustrated in a larger proportion for the ease of viewing but are not intended to limit the disclosure. In addition, for the same reason, some of the elements or components in the drawings may be illustrated in dotted lines.

Herein, the terms, such as "end", "part", "portion", "area", may be used to refer to specific features of or between elements or components but are not intended to limit the elements and components. In addition, the terms, such as "substantially" and "approximately", as used herein may mean a reasonable amount of deviation of the described term such that the end result is not significantly changed.

Further, unless explicitly stated, the term "at least one" as used herein may mean that the quantity of the described element or component is one or larger than one but does not necessarily mean that the quantity is only one. The term "and/or" may be used herein to indicate that either or both of two stated possibilities.

Figure 2:
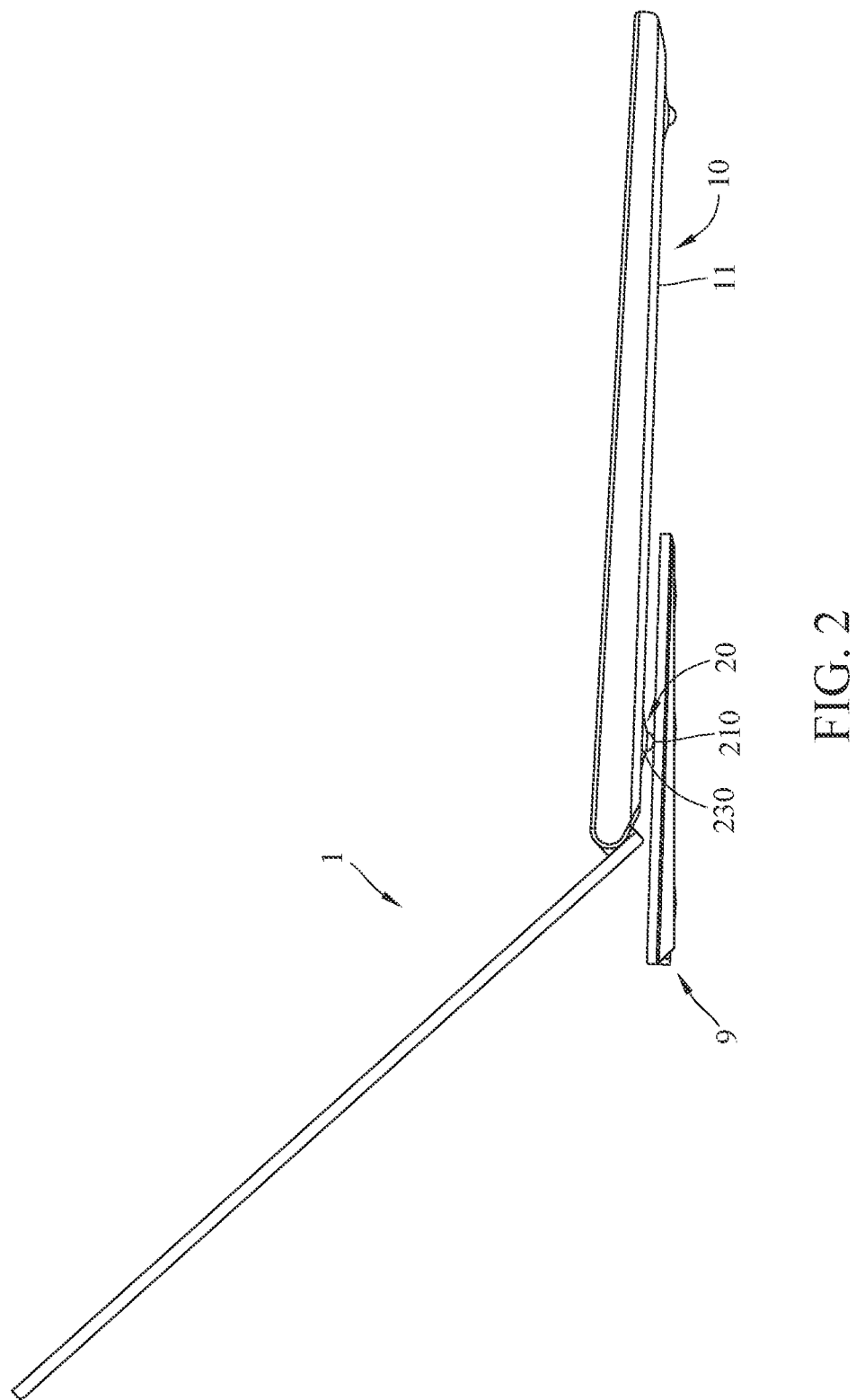
FIG. 2 is a side view of the electronic device and the charger pad in FIG. 1.
Figure 3:
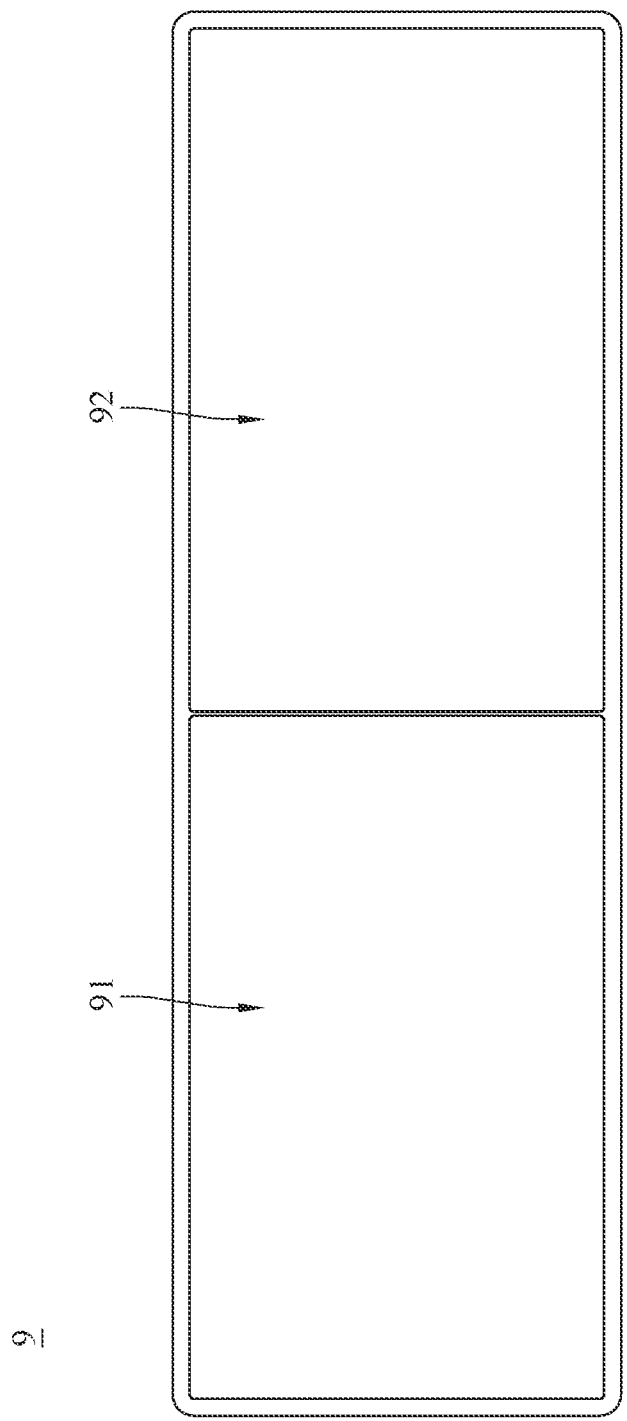
FIG. 3 is a top view of the charger pad in FIG. 1.
Figure 4:
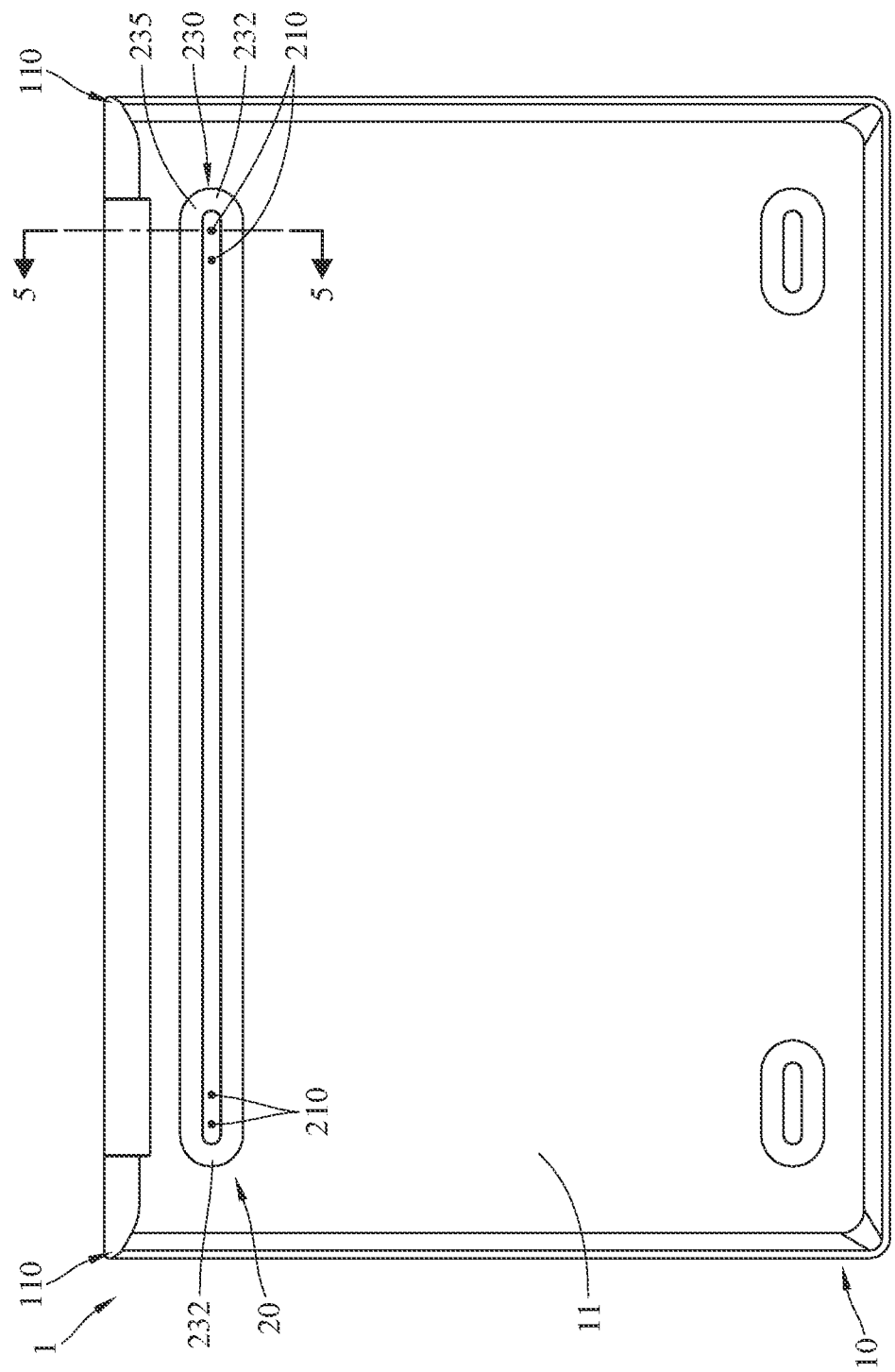
FIG. 4 is a bottom view of the electronic device in FIG. 1.

Firstly, referring to FIGS. 1-4, one embodiment of the disclosure provides an electronic device 1 and a charger pad 9 capable of charging the electronic device 1, where FIG. 1 is a perspective view of the electronic device 1 according to one embodiment of the disclosure when being placed on the charger pad 9, FIG. 2 is a side view of the electronic device 1 and the charger pad 9 in FIG. 1, FIG. 3 is a top view of the charger pad 9 in FIG. 1, and FIG. 4 is a bottom view of the electronic device 1 in FIG. 1. Note that the electrical/non-electrical components, such as wires/cables, traces, that are relatively irrelevant to the spirit of the disclosure are omitted or simplified from the drawings for clarity and ease of understanding the disclosure.

In this embodiment, the electronic device 1 is but not limited to a notebook computer. Note the electronic device 1 in the form of a notebook computer is merely for ease of explanation but does not limit the disclosure in all aspects. The electronic devices in other embodiments may be in the form of other electronic products, such as smartphone, tablet, or wearable device.

The charger pad 9 is a device configured for charging the electronic device 1 when the electronic device 1 is placed the charger pad 9. As shown, the charger pad 9 is flat in shape and its upper surface is used to support the electronic device 1 and has two areas of opposite electrodes for charging the electronic device 1, a first electrode area 91 and a second electrode area 92. One of the first electrode area 91 and the second electrode area 92 is positive electrode, and the other is negative electrode. Correspondingly, the electronic device 1 has a plurality of metal pins 210 protruding from its bottom. When the electronic device 1 is placed on the charger pad 9, the metal pins 210 are respectively in electrical contact with the first electrode area 91 and the second electrode area 92 so as to form a charging path over the electronic device 1 and the charger pad 9 for charging the electronic device 1.

Thus, the electronic device 1 can be wirelessly charged by simply contacting the metal pins 210 with areas of different electrodes of the charger pad 9. As shown, the first electrode area 91 and the second electrode area 92 both have a relatively large area available for having contact with the metal pins 210, allowing highly flexible placement of the electronic device 1 onto the charger pad 9 during charging.

Figure 5:
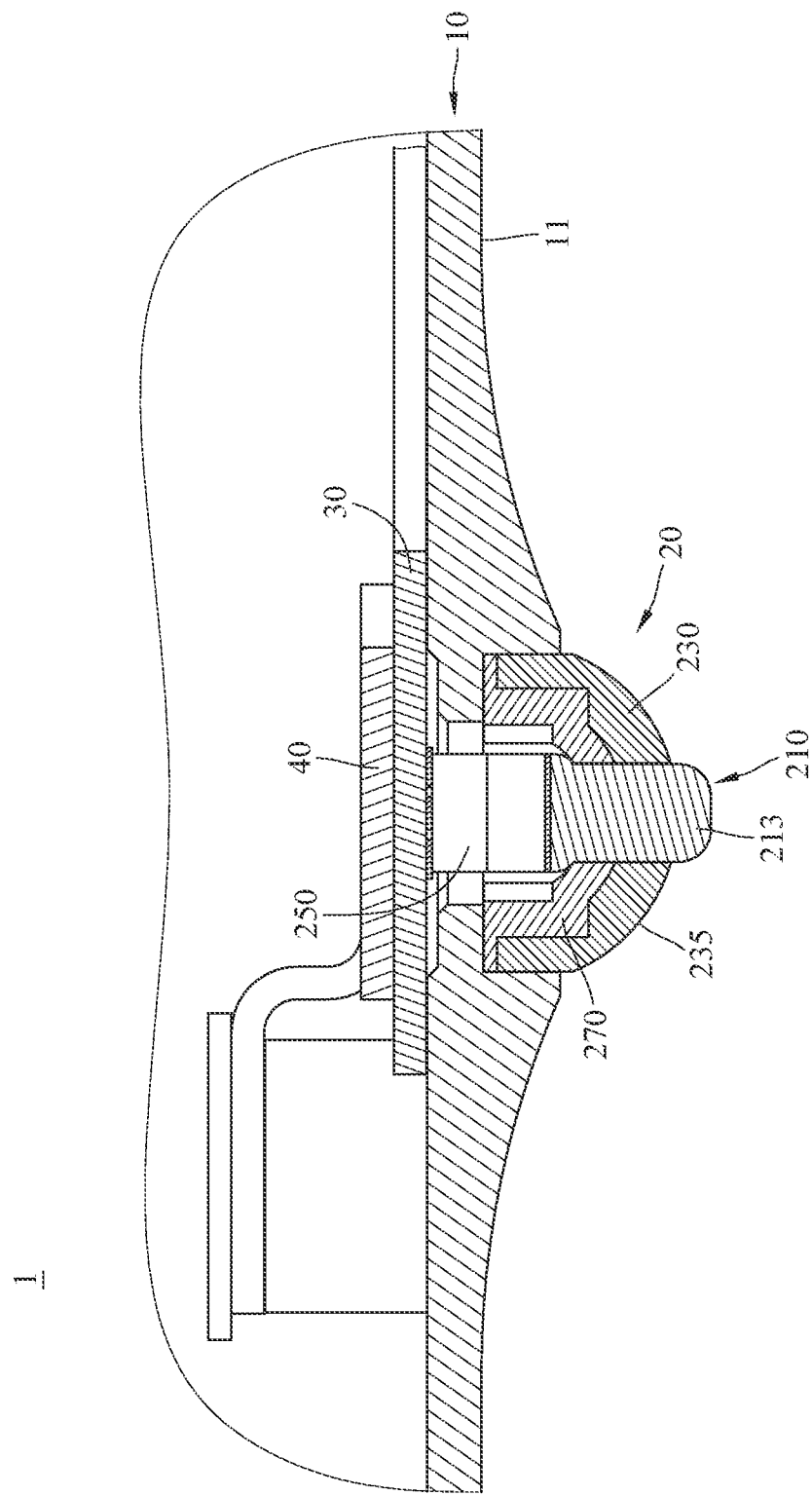
FIG. 5 is a partially-enlarged cross-sectional view of the electronic device taken along line 5-5 of FIG. 4.
Figure 6:
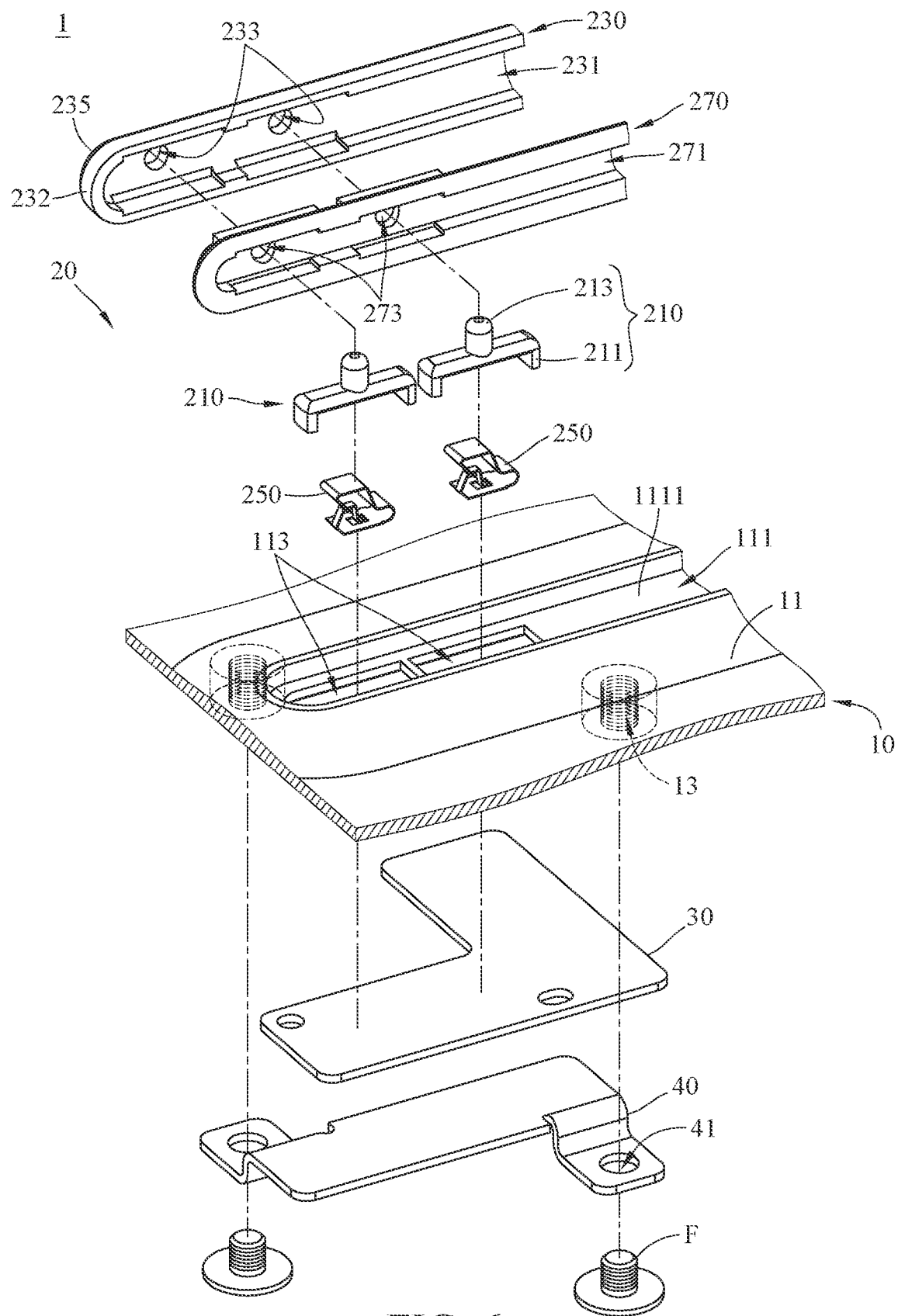
FIG. 6 is a partial exploded view of the electronic device in FIG. 5.

Then, please referring to FIGS. 5-6, the detail related to the metal pins 210 of the electronic device 1 are provided, wherein FIG. 5 is a partially-enlarged cross-sectional view of the electronic device 1 taken along line 5-5 of FIG. 4, and FIG. 6 is a partial exploded view of the electronic device 1 in FIG. 5.

As shown, in this embodiment, the electronic device 1 at least includes a casing 10 and a charging foot seat 20. The casing 10 basically means the part of the electronic device 1 that is mainly served as an outer structure to protect and enclose various electrical and non-electrical components of achieving required functions. The charging foot seat 20 is arranged on an outer surface 11 of the casing 10, and at least part of the charging foot seat 20 protrudes outwards from the outer surface 11. Viewing from the angle of the drawing, when the electronic device 1 is in the normal use, the outer surface 11 is located at the bottom of the casing 10 and faces downwards, thus, in the following paragraphs, the outer surface 11 may also be served as and called as a bottom surface of the casing 10. The charging foot seat 20 not only can be served as the conventional foot pad (also known as "laptop feet") of notebook computers but also can be part of the charging path for the electronic device 1 to receive electric energy from the charger pad 9. That is, the charging foot seat 20 is able to form the path that the charger pad 9 provides electricity to the electronic device 1. The detailed descriptions are given below.

In this embodiment, there is a recessed portion 111 recessed from the bottom surface 11 of the casing 10. The recessed portion 111 is a long recess on the bottom surface 11 and is configured to accommodate at least part of the charging foot seat 20; in other words, at least part of the charging foot seat 20 is embedded in the recessed portion 111 of the casing 10, and the rest part of the charging foot seat 20 is exposed and protruding outwards from the bottom surface 11 of the casing 10. Also, the casing 10 has at least two through holes 113 located at a recess bottom surface 1111 of the recessed portion 111, where the recess bottom surface 1111 means the surface at the bottom of the recessed portion 111. In addition, there is at least one circuit board 30 being accommodated in the casing 10.

The circuit board 30 is fixed in place with respect to the through holes 113 via the mount 40. In specific, the mount 40 has at least one through hole 41 allowing the insertion of fastener F (e.g., screw), the fastener F can be inserted through the through hole 41 and screwed into a threaded hole 3 of the casing 10 so as to fix the mount 40 onto the casing 10, and the circuit board 30 can be fixed with the casing 10 or mount 40 via any suitable manner, such as adhesive or screw so as to be clamped by the mount 40 and the casing 10. In such an arrangement, the mount 40 fixed to the casing 10 is able to firmly secure the position of the circuit board 30 with respect to the through holes 113 of the casing 10.

The charging foot seat 20 may include at least two metal pins 210, a foot pad 230, and at least two elastic connecting pieces 250. Generally, the metal pins 210 are movable and electrically connected to the circuit board 30 due to the elastic connecting pieces 250, the foot pad 230 protrudes outwards from the bottom surface 11 of the casing 10 and is sleeved on the metal pins 210, and the metal pins 210 are retractably protruding the foot pad 230 via the elastic connecting piece 250. In addition, regarding the locations of the metal pins 210, the metal pins 210 are arranged adjacent to two opposite ends 232 of the foot pad 230.

In more detail, the metal pins 210 can be made of any suitable electrically conductive metal, and there are four metal pins 210 on the electronic device 1, two of them are for the conducting path with the first electrode area 91, and the other two are for the conducting path with the second electrode area 92. As shown, the areas near the opposite corners of the bottom surface 11 (or, the areas near the opposite ends 232 of the foot pad 230) each have two metal pins 210, but such an arrangement is exemplary and not intended to limit the disclosure. It is understood that the minimum number of the metal pins 210 is two since each electrode area requires at least one metal pin, thus, in the electronic devices of other embodiments, the opposite corners (or opposite ends of the foot pad) may each have only one or more than two metal pins.

In more detail, in this embodiment, the metal pins 210 each include a base portion 211 and a protrusion portion 213 protruding outwards from a side of the base portion 211. As shown, the base portion 211 may have a U shape spanning on the respective elastic connecting piece 250, and the protrusion portion 213 may have a cylindrical shape. In other words, the elastic connecting piece 250 is suitable for being placed in the recess of the U-shaped base portion 211. This arrangement is favorable for maintaining the relationship between the metal pins 210 and the elastic connecting pieces 250.

The elastic connecting pieces 250 can be made of any suitable electrically conductive and elastic metal, there are the same number of elastic connecting pieces 250 as the metal pins 210, and the elastic connecting pieces 250 are corresponding in location to the metal pins 210. In specific, one end of the elastic connecting piece 250 is electrically connected to the circuit board 30 and another end thereof is electrically connected to the base portion 211 of the metal pin 210 so as to electrically connect the metal pin 210 to the circuit board 30. In other words, the metal pins 210 are disposed in positions and electrically connected to the circuit board 30 via the elastic connecting pieces 250. Thus, as the metal pins 210 contact the charger pad 9, the charger pad 9 is electrically connected to the circuit board 30 via the metal pins 210 and the elastic connecting pieces 250.

Figure 8:
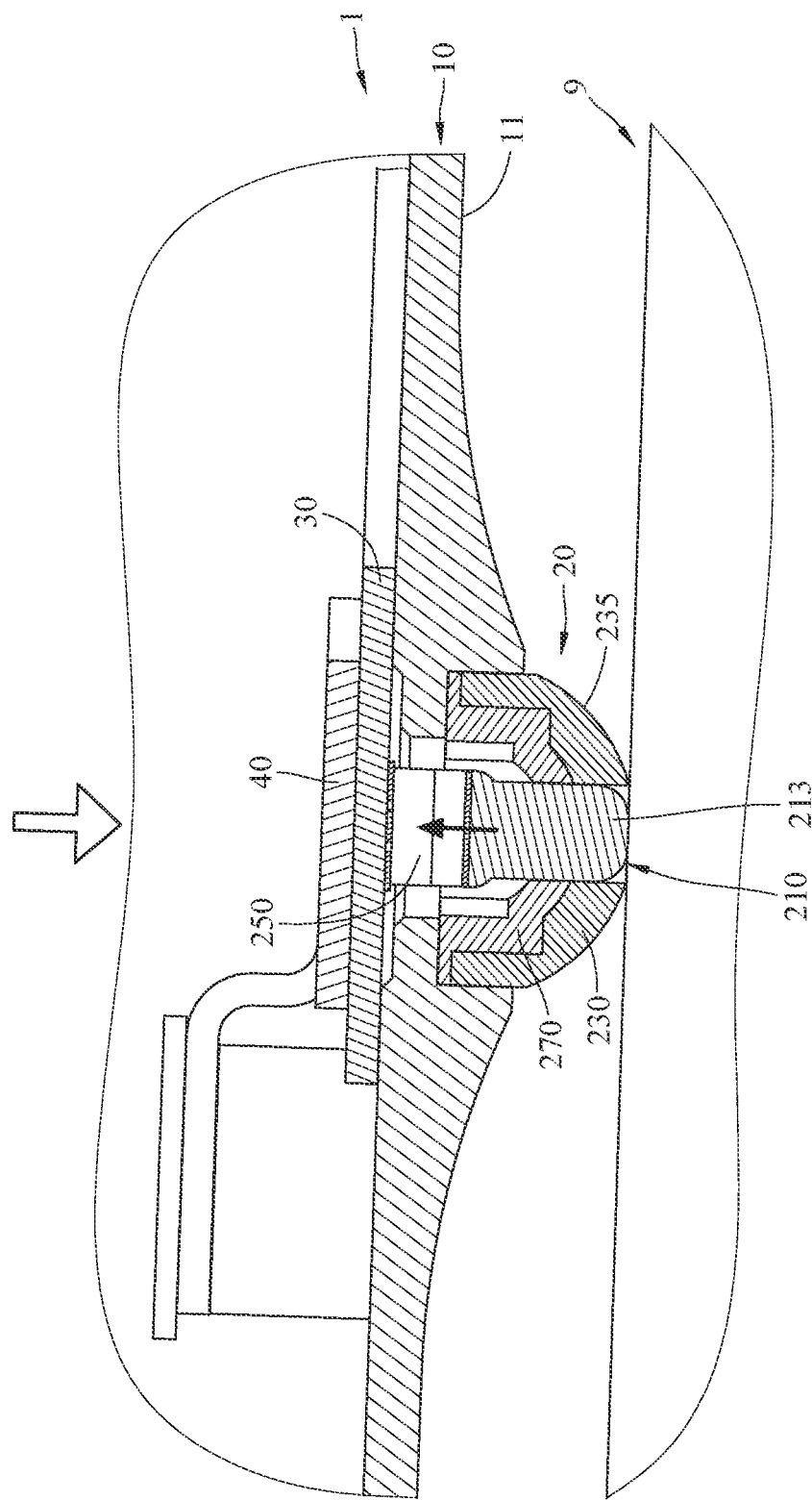

In addition, the shape and material of the elastic connecting piece 250 are suitable for it to be responsive to the pressure applied by the metal pins 210. Thus, when the metal pin 210 applies pressure on the elastic connecting piece 250, the elastic connecting piece 250 can be deformed so that the metal pin 210 is allowed to move with respect to the circuit board 30. As shown, the base portion 211 of the metal pin 210 is maintained at the through hole 113 of the recessed portion 111 by being held by the elastic connecting piece 250, when the metal pin 210 is moved to deform the elastic connecting piece 250 (as shown in FIG. 8), the metal pin 210 is relatively moved towards the circuit board 30 due to the deformation of the elastic connecting piece 250, but when the force applied on the metal pin 210 is removed, the elastic connecting piece 250 is able to restore the metal pin 210 back to its original position. Note that the elastic connecting piece shown in the drawings is exemplary, any suitable conductive and elastic structure that is capable of achieving the same purpose can be employed as the elastic connecting piece of the disclosure.

The foot pad 230 may be made of the material (e.g., rubber) that typically can prevent slipping and damaging and impact from a hard surface. The foot pad 230 may have an accommodating portion 231, a plurality of through holes 233, and a contact surface 235. At least part of the foot pad 230 is embedded into the casing 10. Specifically, at least part of the foot pad 230 is inserted into the recessed portion 111 of the casing 10, and the other part of the foot pad 230 protrudes from the bottom surface 11 of the casing 10, the contact surface 235 is the surface of the foot pad 230 exposed from the casing 10 and used to contact with surfaces, such as table or charger pad 9. The accommodating portion 231 is located at the inner side of the foot pad 230 and can be considered as the hollow portion of the foot pad 230. The through holes 233 penetrate through the contact surface 235 and are connected to the accommodating portion 231.

The base portions 211 of the metal pins 210 are located in the accommodating portion 231 of the foot pad 230 and the protrusion portions 213 of the metal pins 210 are respectively disposed through the through holes 233 of the foot pad 230. When there is no additional external force applied on the metal pins 210, the elastic connecting pieces 250 hold the protrusion portions 213 of the metal pins 210 in a position of sticking out the through holes 233, such that the protrusion portions 213 are protruding outwards from the contact surface 235 of the foot pad 230. As shown, the metal pins 210 are more protruding than the contact surface 235 from the bottom surface 11 (or the outer surface) of the casing 10. When the protrusion portion 213 is forced to move inwards, the metal pins 210 deform the elastic connecting piece 250 (as shown in FIG. 8), such that the metal pins 210 can be moved towards the accommodating portion 231 and may only have a small portion sticking out the contact surface 235 of the foot pad 230 or become substantially align with the contact surface 235 of the foot pad 230.

In addition, in this embodiment, the charging foot seat 20 may further include at least one inner frame 270 being clamped by the foot pad 230 and the recess bottom surface 1111 of the recessed portion 111. The inner frame 270 is able to protect the metal pins 210 from the deformation of the foot pad 230. In specific, the inner frame 270 may be made of plastic having a certain level of rigidity, the inner frame 270 may have an accommodating portion 271 and a plurality of through holes 273, at least part of the inner frame 270 is accommodated in the accommodating portion 231 of the foot pad 230 and located between the foot pad 230 and the base portions 211 of the metal pins 210, the base portions 211 are accommodated in the accommodating portion 271 of the inner frame 270, and the protrusion portions 213 of the metal pins 210 are respectively disposed through the through holes 273 of the inner frame 270. In such an arrangement, the inner frame 270 is able to protect the base portions 211 of the metal pins 210 and the elastic connecting pieces 250 in contact with the base portions 211 from the pressing due to the deformation of the foot pad 230, thus the external force is only allowed to apply on the protrusion portions 213 of the metal pins 210 when pushing the metal pins 210 and the elastic connecting pieces 250.

Figure 7:
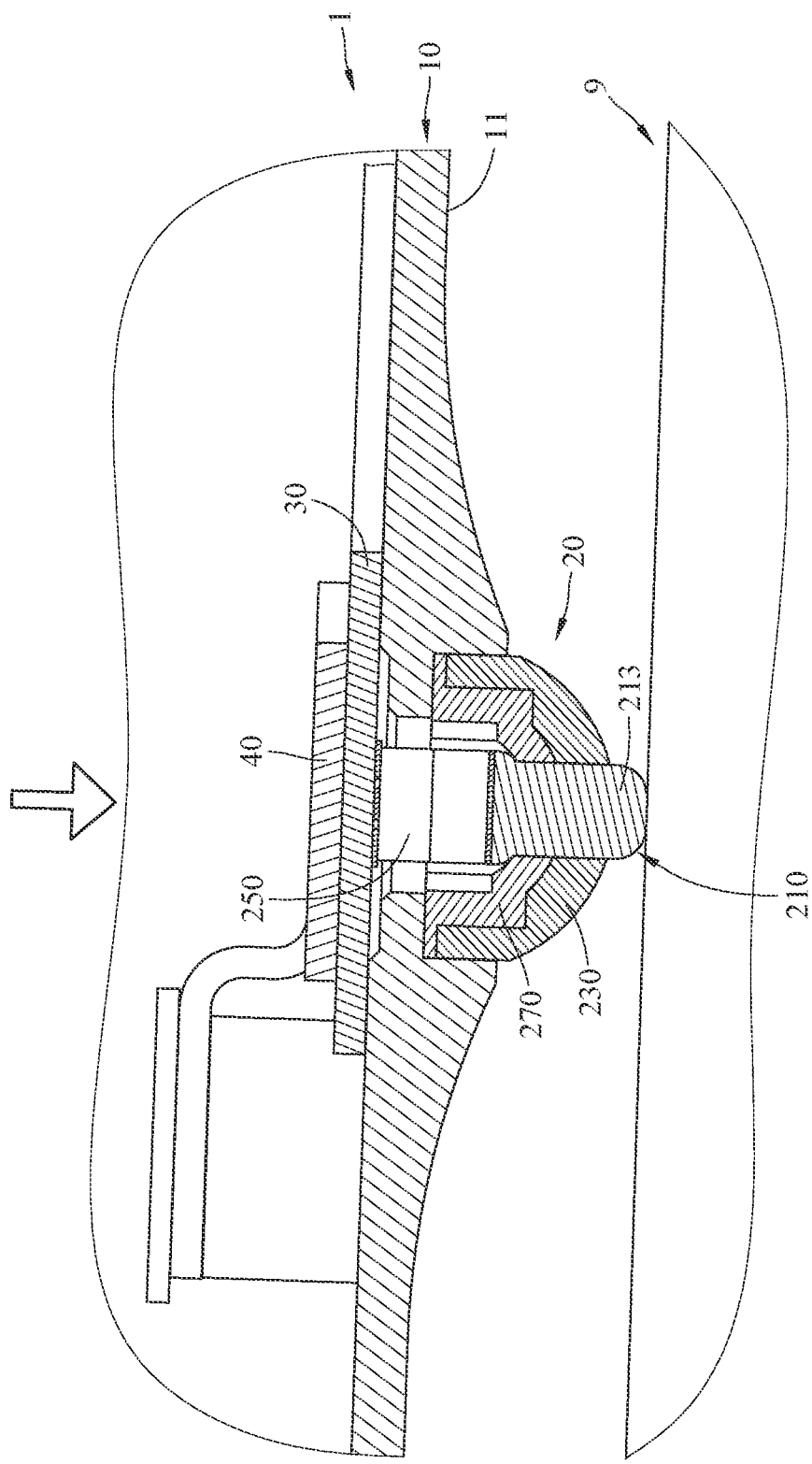
FIGS. 7-8 are partially-enlarged side views of the electronic device in FIG. 1 during its placement on the charger pad.

Then, referring to FIGS. 7-8 to introduce the usage of the charging foot seat 20, where FIGS. 7-8 are partially-enlarged side views of the electronic device 1 during the placement of one of the metal pins onto the charger pad Taking one of the metal pins 210 as an example to explain the placement of the charging foot seat 20 of the electronic device 1, but it is understood that all of the metal pins 210 will have the same reaction when the electronic device 1 is placed on the charger pad 9.

Firstly, in FIG. 7, as the electronic device 1 is to be placed on the charger pad 9, the metal in 210 will firstly contact the charger pad 9. At this moment, the charger pad 9 is electrically connected to the circuit board 30 via the metal pin 210 and the elastic connecting piece 250, such that the metal pins 210 are able to be respectively in electrical contact with the first electrode area 91 and the second electrode area 92 of the charger pad 9 so as to form a charging path over the electronic device 1 and the charger pad 9 and begin to charge or provide electricity to the electronic device 1. Note that the quantity of the circuit board to achieve the charging path can be modified as required.

Then, the electronic device 1 can be released to let its weight against the metal pin 210 so as to force the metal pin 210 and the elastic connecting piece 250 between the metal pin 210 and the circuit board 30 to deform, such that the protrusion portion 213 of the metal pin 210 is retracted into the foot pad 230 in a direction towards the circuit board 30. During the movement of the metal pin 210, the protrusion portion 213 is still in electric contact with the charger pad 9 under the protection of the foot pad 230. When the electronic device 1 is statically placed on the charger pad 9, the foot pad 230 contacts the surface of the charger pad 9 with its contact surface 235 so as to prevent the electronic device 1 from slipping on the charger pad 9 and ensure that the electronic device 1 stably rests on the charger pad 9.

As discussed, one embodiment of the disclosure provides an electric contacting manner using elastic metal pins, but it occupies relatively small space, is cost-saving, and provides a higher efficient path for energy transmission compared to the coil-type wireless charger, and thus it does not cause problems with heat generation. Also, the sticking-out metal pins 210 on the electronic device 1 allow the electronic device 1 to work with a novel charger pad (e.g., the charger pad 9), having the advantage of metal pin charging and being more flexible and convenient compared to the charging using male pin inserting into mating female port.

The above embodiments are exemplary and not intended to limit the disclosure. The electronic devices of other embodiments are given below but for clarity and simple illustration, only the differences from the above embodiments will be described, the similar or same parts thereamong will not be repeated hereinafter.

Figure 9:
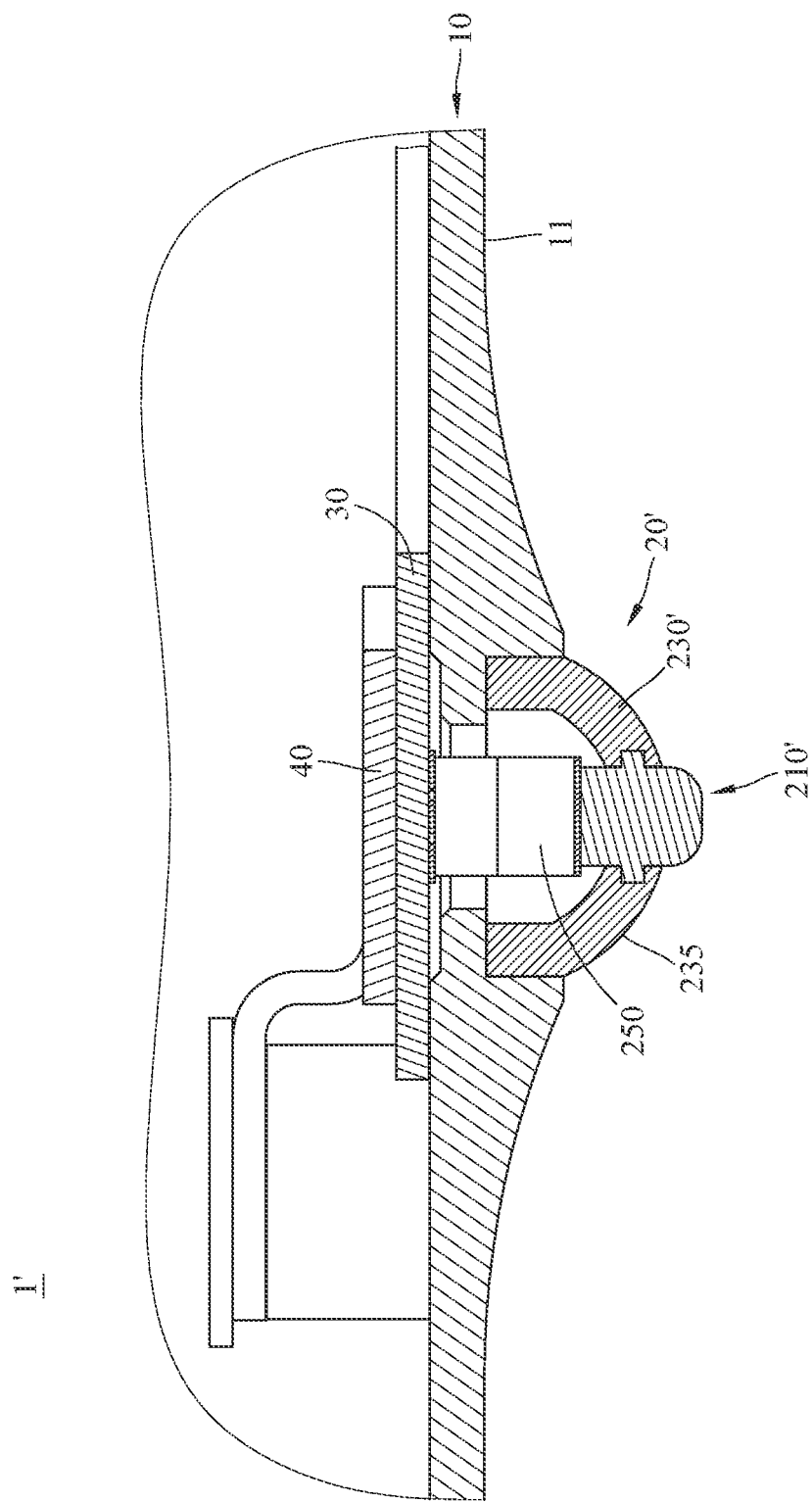
FIG. 9 is a partially-enlarged cross-sectional side view of an electronic device according to another embodiment of the disclosure.
Figure 10:
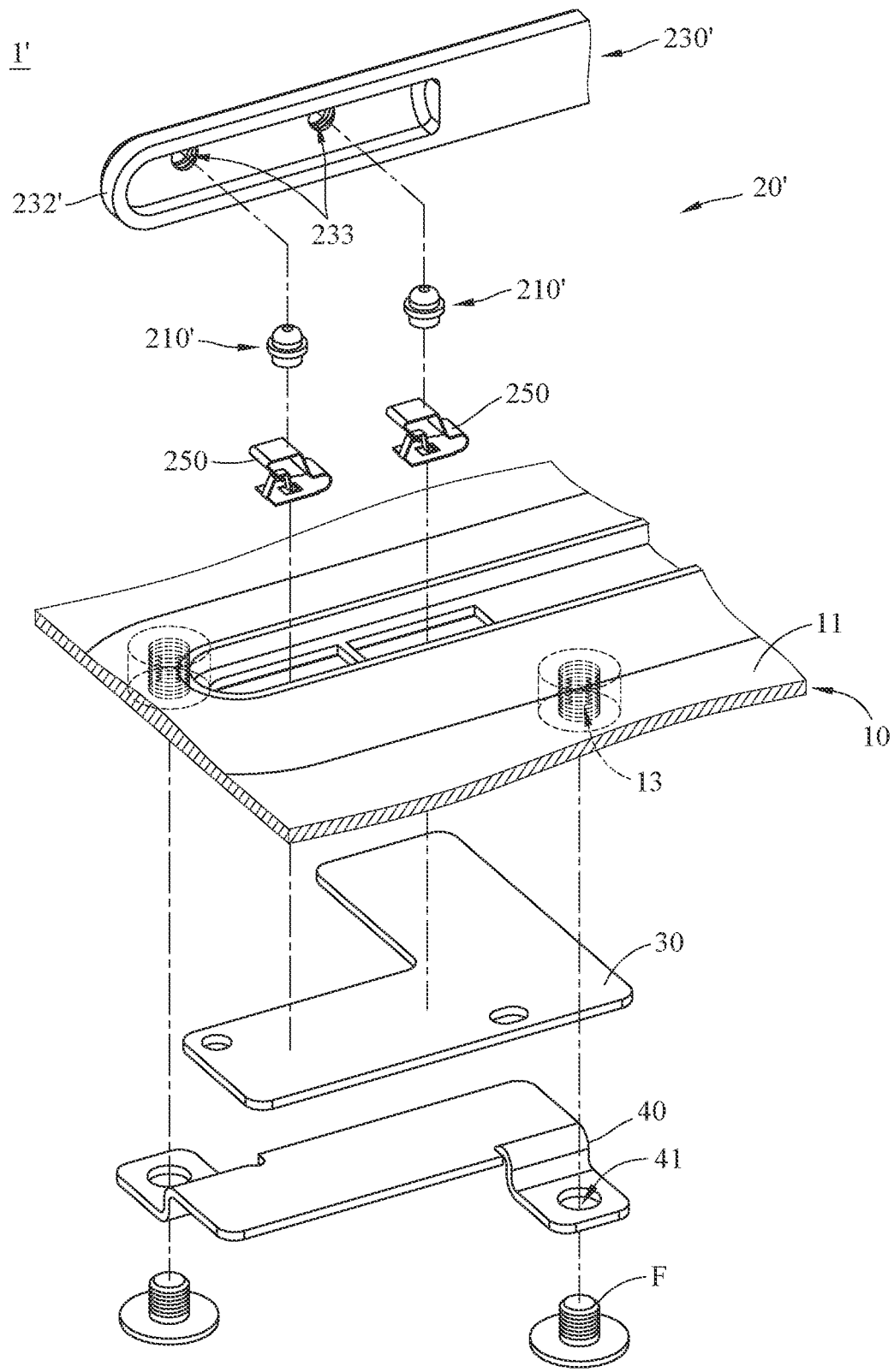
FIG. 10 is a partially-enlarged exploded view of the electronic device in FIG. 9.

For example, referring to FIGS. 9-10, where FIG. 9 is a partially-enlarged cross-sectional side view of an electronic device 1' according to another embodiment of the disclosure, and FIG. 10 is a partially-enlarged exploded view of the electronic device 1' in FIG. 9, in a charging foot seat 20' of this embodiment, metal pins 210' are also arranged at two opposite ends 232' of a foot pad 230', but the metal pins 210' are fixed with the foot pad 230'. In specific, the metal pin 210' is disposed through the through hole 233 of the foot pad 230' but its position relative to the foot pad 230' is fixed thus is unable to further stick out or retracted into the foot pad 230'. As shown, the metal pin 210' being embedded into the foot pad 230' with one end protruding from the contact surface 235 and the other end protruding from another surface of the foot pad 230' opposite to the contact surface 235, the metal pin 210' is electrically connected to the elastic connecting piece 250, and there is a room at the inner side of the foot pad 230' available for the movement of the metal pin 210'.

Figure 11:
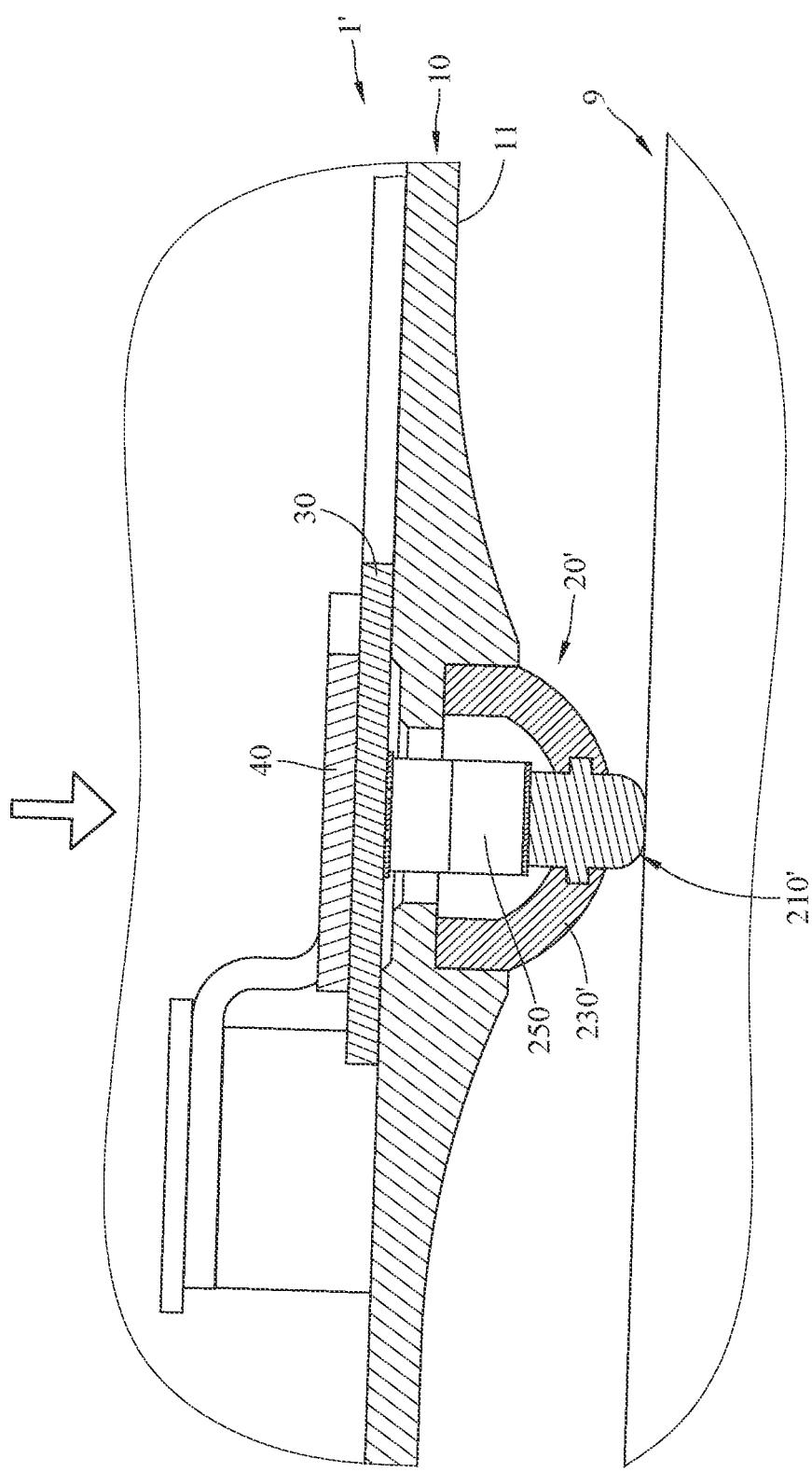
FIGS. 11-12 are partially-enlarged side views of the electronic device in FIG. 9 during its placement on the charger pad.
Figure 12:
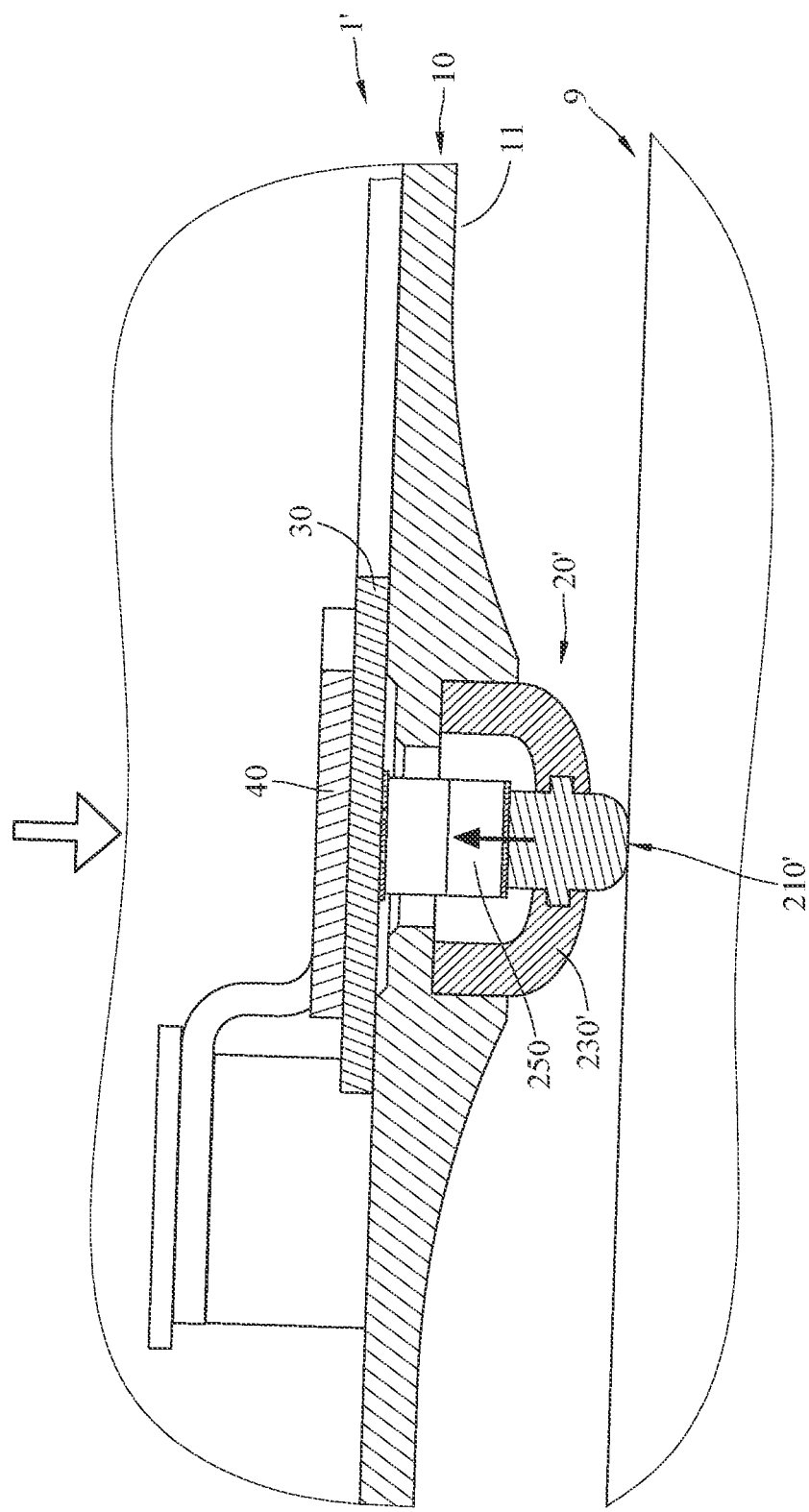

Then, referring to FIGS. 11-12, in FIG. 11, the charger pad 9 is electrically connected to the circuit board 30 via the metal pin 210' and the elastic connecting piece 250, beginning to charge the electronic device 1'. Then, in FIG. 2, the weight of the electronic device 1' against the metal pin 210' and the elastic connecting piece 250 causes the elastic connecting piece 250 to deform and the metal pin 210' to move towards the circuit board 30, and the foot pad 230' is deformed due to the movement of the metal pin 210'. Thus, the metal pin 210' is still in electric contact with the charger pad 9.

According to the electronic devices and the charging foot seats as discussed in the above embodiments of the disclosure, the metal pins being electrically connected to the circuit board are disposed through and protruding the foot pad on the casing of the electronic device; that is, the electronic device has metal pins on its foot pad, which allows the electronic device to adapt the novel charger pad.

In specific, unlike the coil-type wireless charger, the charger pad has two electrode areas of opposite electrodes for forming a charging path with the specific device placed on the charger pad. Thus, when the electronic device as discussed above is placed on the charger pad with its foot pad in contact with the electrode areas, a charging path will be formed over the metal pins and the charger pad. As such, the foot pad of the disclosure not only can be served as the conventional rubber feet but the elastic metal pins thereon can also be part of the charging path for charging the electronic device from the novel charger pad.

Comparing to the coil-type wireless charger, the electronic device as discussed above receives power by directly contacting the metal pins with the charger pad, thus the charging is high efficient and simple and does not cause problems with heat generation. In addition, comparing to the charging using male pin inserting into mating female port, the disclosure arranges the metal pins on the electronic device, thus, as discussed above, the charging path can be formed by simply placing the foot pad on the charger pad to let its metal pins contact the respective areas of the charger pad without the need to carefully position the charging terminals, making the charging high flexible and convenient.

Accordingly, with the above arrangement of the embodiment of the disclosure, the electronic device is able to work with the novel charger pad, having the advantage of metal pin charging while being more flexible and convenient than conventional wireless charging manners.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:
1. An electronic device, comprising:
   a casing;
   at least one circuit board, accommodated in the casing;
   a foot pad, protruding from the casing, wherein the food pad has an outermost surface opposite to the casing and outside the casing; and
   a plurality of metal pins, disposed through and protruding from the outermost surface of the foot pad and electrically connected to the at least one circuit board.

2. The electronic device according to claim 1, further comprising a plurality of elastic connecting pieces, one end of the plurality of elastic connecting pieces is disposed at and electrically connected to the at least one circuit board, the plurality of metal pins respectively disposed at and electrically connected to another end of the plurality of elastic connecting pieces.

3. The electronic device according to claim 2, wherein the casing has a recessed portion, the recessed portion has a recess bottom surface, at least part of the foot pad is located in the recessed portion so as to cover the recess bottom surface, the foot pad has an accommodating portion and a plurality of through holes connected to the accommodating portion, the plurality of elastic connecting pieces are disposed through the recess bottom surface, at least part of each of the plurality of elastic connecting pieces is located in the accommodating portion, and the plurality of metal pins are respectively retractably located at the plurality of through holes.

4. The electronic device according to claim 3, wherein each of the plurality of metal pins comprises a base portion and a protrusion portion, the protrusion portion protrudes from a side of the base portion, the base portion has a U shape, the protrusion portions of the plurality of metal pins are respectively disposed through the plurality of through holes, and the base portions of the plurality of metal pins respectively span on the plurality of elastic connecting pieces.

5. The electronic device according to claim 4, further comprising at least one inner frame being accommodated in the accommodating portion of the foot pad and clamped by the foot pad and the recess bottom surface.

6. The electronic device according to claim 5, wherein at least part of the at least one inner frame is clamped by the base portions of the plurality of metal pins and the foot pad.

7. The electronic device according to claim 2, wherein the casing has a recessed portion, the recessed portion has a recess bottom surface, at least part of the foot pad is located in the recessed portion to cover the recess bottom surface, the foot pad has an accommodating portion, the plurality of elastic connecting pieces are disposed through the recess bottom surface, at least part of each of the plurality of elastic connecting pieces is located in the accommodating portion, and the plurality of metal pins are disposed through and fixed to the foot pad.

8. The electronic device according to claim 7, wherein when the plurality of metal pins is moved towards the at least one circuit board, the plurality of metal pins deforms the plurality of elastic connecting pieces and the foot pad.

9. The electronic device according to claim 1, wherein the foot pad has a contact surface exposed and protruding outwards from the casing, the plurality of metal pins are disposed through the contact surface and are more protruding than the contact surface from an outer surface of the casing.

10. The electronic device according to claim 1, wherein the plurality of metal pins are respectively arranged adjacent to two opposite ends of the foot pad.

11. The electronic device according to claim 1, wherein the plurality of metal pins respectively are respectively arranged adjacent to two opposite corners of the casing.

12. The charging foot seat according to claim 1, wherein the outermost surface of the foot pad is convex.

13. An electronic device, adapted to be charged by a charger pad, the electronic device comprising:
  a casing, adapted to be placed on the charger pad;
  at least one circuit board, accommodated in the casing;
  a foot pad, protruding from the casing, wherein the food pad has an outermost surface opposite to the casing and outside the casing; and
  a plurality of metal pins, disposed through and protruding from the outermost surface of the foot pad and electrically connected to the at least one circuit board, wherein the plurality of metal pins are configured to contact the charger pad so as to form a charging path over the at least one circuit board and the charger pad for charging the electronic device.

14. The electronic device according to claim 13, wherein the plurality of metal pins are retractably protruding the foot pad.

15. The electronic device according to claim 13, wherein the plurality of metal pins are fixed with the foot pad.

16. A charging foot seat for an electronic device, the electronic device comprising a casing and at least one circuit board accommodated in the casing, the charging foot seat comprising:
  a foot pad, configured to be partially embedded into the casing, wherein the food pad has an outermost surface opposite to the casing and outside the casing; and
  a plurality of metal pins, disposed through and protruding from the outermost surface of the foot pad and configured to be electrically connected to the at least one circuit board.

17. The charging foot seat according to claim 16, wherein the plurality of metal pins are retractably protruding the foot pad.

18. The charging foot seat according to claim 16, wherein the plurality of metal pins are fixed with the foot pad.

* * * * *